United States Patent [19]
Wang et al.

[11] Patent Number: 6,081,465
[45] Date of Patent: Jun. 27, 2000

[54] STATIC RAM CIRCUIT FOR DEFECT ANALYSIS

[75] Inventors: Jonathan Wang, Albany, Oreg.; Dietrich W. Vook, Menlo Park, Calif.

[73] Assignee: Hewlett-Packard Company, Palo Alto, Calif.

[21] Appl. No.: 09/070,820

[22] Filed: Apr. 30, 1998

[51] Int. Cl.$^7$ ..................................................... G11C 7/00
[52] U.S. Cl. ........................... 365/201; 365/154; 365/203
[58] Field of Search .................... 365/201, 154, 365/156, 203, 189.01, 129; 371/21.1

[56] References Cited

U.S. PATENT DOCUMENTS

| | | | |
|---|---|---|---|
| 4,835,458 | 5/1989 | Kim ........................................ | 324/73 R |
| 5,034,923 | 7/1991 | Kuo et al. ............................ | 365/189.01 |
| 5,416,740 | 5/1995 | Fujita et al. ............................. | 365/200 |
| 5,428,574 | 6/1995 | Kuo et al. ................................. | 365/201 |
| 5,469,076 | 11/1995 | Badyal et al. ............................. | 326/16 |
| 5,526,314 | 6/1996 | Kumar ..................................... | 365/207 |
| 5,615,157 | 3/1997 | Nakashima et al. ..................... | 365/201 |

FOREIGN PATENT DOCUMENTS

| | | |
|---|---|---|
| 8-45299 | 2/1996 | Japan . |
| 9-213896 | 8/1997 | Japan . |

*Primary Examiner*—David Nelms
*Assistant Examiner*—Hoai V. Ho
*Attorney, Agent, or Firm*—Raymond A. Jenski

[57] ABSTRACT

Small feature CMOS defect analysis of SRAM circuits is made less time consuming with the inclusion of an in-circuit test connection which is brought to external contact pads. External measurement and circuit forcing are accomplished via the external contact pads. A fault library for comparison to automated tests results provides faster resolution of process defects.

16 Claims, 8 Drawing Sheets

—PRIOR ART—

STATIC RAM CIRCUIT FOR DEFECT ANALYSIS

BACKGROUND OF THE INVENTION

The present invention is related to integrated circuit (IC) technology and more particularly related to defect analysis of static random access memory (SRAM) circuits, particularly when such circuits are employed in the characterization of new CMOS manufacturing processes.

With each successive generation of IC technology, the feature sizes become smaller by a factor of approximately 70%. During the development of a new generation of IC technology, it is important to be able to identify and analyze process-induced defects, especially those that cause electrical circuit failures. Corrective measures can then be taken in the developing process to remedy the defects. It is common to use SRAM circuits to do this debugging, since an electrical signal of a defect can be traced to a particular physical location. Historically, the smallest unit of SRAM, a bit cell, consisting of six particular transistors disposed in a small area of the IC wafer surface, is located and physically analyzed by removing successive layers of processed semiconductor material or metalization to look for physical defects. With the advance of technology, the area of the bit cell has become so small that many defects are no longer detectable under a microscope.

Since physical defects are the most easily identified and account for most of the detected failure mechanisms of the process, an analysis of the defective SRAM circuits is instructive. A quantity of wafers (a "lot") are processed using the CMOS process under development. Wafers containing the SRAM circuits are functionally tested and core failure locations (anomalous memory cells) are mapped using software programs previously developed for this purpose. Representative wafers from the lot are selected for analysis based on the defectivity rates or development areas which are of interest. Analysis proceeds with visual inspection of the defective cells using an optical microscope. Suspicious locations are further evaluated using a scanning electron microscope (SEM), if needed. The wafers are then deprocessed using wet chemical or plasma etch sequences to expose successively lower structural levels and another inspection is performed. This cycle continues until all defects have been characterized or the wafer is deprocessed completely to bare silicon. It may also be instructive, along with imaging defects with an SEM, to undertake cursory elemental analysis using Energy Dispersive Spectral Analysis (EDS) to obtain an understanding of the elemental composition of the defects detected.

Typically, a large percentage of failures falls into the category of "non-visible defect" (NVD)—meaning that no defect could be found. If this is a limiting category, a laborious benchtest characterization of like failures in this or other wafers in the lot is undertaken. The electrical defect types can be identified and subsequently analyzed to understand a physical mechanism responsible for the defect. Because of the high labor content required to perform this type of electrical analysis, it is usually only practical to sample failing cells up to the point that there is confidence that a key failure mechanism is identified or understood.

A conventional six-transistor SRAM bit cell 100 is shown in the schematic of FIG. 1. One inverting amplifier consisting of a P-channel MOS transistor 101 and a n N-channel MOS transistor 103 are connected to a second inverting amplifier consisting of P-channel transistor 105 and an N-channel MOS transistor 107 in an input-to-output fashion conventionally known as a latch. Direct current power is supplied VDD to ground, as conventionally shown. An N-channel MOS transistor 109 couples the latch to one bit line BIT and an N-channel MOS transistor 111 couples the latch to a second bit line BIT*, which in normal operation provides binary complement data to data found on the BIT line. The gate of both transistors 109 and 111 are coupled to a word line WL.

It has been shown that defects within such a bit cell can be identified by isolating the bit cell from the power supply, the power supply return (ground), and the remainder of the circuits on the wafer and then supplying controlled power and bias to selected nodes by way of microprobes contacting these nodes at the IC surface. In U.S. Pat. No. 4,835,458, static gate and drain voltage/current characteristics are shown to be measured for selected transistors. Comparisons of characteristics between defective and good transistors can be used to detect the failure mechanism of failed bit cells. As noted before, however, microprobe analysis is a laborious and expensive process for repeated analysis.

Column and row select decoding algorithms have been developed for the particular address space used by the IC; that is, single-bit, four-bit, eight-bit, or the like data groupings. Each column, as shown in FIG. 2, comprises a set of bit cells 100, 100' connected to common BIT and BIT* lines. (The asterisk following a control line is used to designate a complement signal). Single bit cells are accessed by selecting a row (word line $WL_1$ or word line $WL_2$, etc.) and appropriate columns. In the "write" mode, the transmission gates 201 and 203 are enabled for the desired columns by WR and WR* lines to the columns and data Dl for the one or more bit cells is written into the bit cell by a write driver 205 found in each column and coupled to the BIT and its complement BIT* lines. "Read" mode allows the data contained in a bit cell to be coupled by way of enabled transmission gates 201 and 203 to one or more sense amps 207 which are usually assigned to each column. In the deselected mode, the BIT and BIT* lines are isolated from the write drivers 205 and the sense amps 207. Further, the BIT and BIT* lines are precharged to a voltage, for example $V_{DD}$, by way of transmission gates 209 and 211 to accelerate access time. The transmission gates 209 and 211 are enabled by a precharge PC signal and its complement, PC*, which are generated logically from the conventional read/write and address circuitry.

It has been shown, for example in U.S. Pat. No. 5,034,923, that additional control logic may be added to exercise the BIT and BIT* lines with non-standard combinations of binary logic states over time and the logic state of the BIT or BIT* determined by independent sense amps for the BIT and BIT* lines. In this way, soft defects characteristic of undesired open circuits may be detected from an improper logic level appearing on one of the BIT or BIT* lines. Such detection does not allow characterization of the transistors comprising a latch circuit at other than the defined logic levels. Thus the opportunity for detection and analysis of other process defect mechanisms is missed.

It can be seen, then, that an improvement is needed in an IC design to enable various process defects to be analyzed without laborious microprobing of the circuit and to provide flexibility in the measurement of circuit characteristics.

SUMMARY OF THE INVENTION

An integrated circuit has external test access to individual bit cells and includes at least one bit cell. A first bit line and a complement bit line are coupled to the at least one bit cell.

A first precharge switch is coupled to the first bit line and a second precharge switch is coupled to the complement bit line. A first test switch couples between the first bit line and a first external contact pad and the first test switch and the first precharge switch are arranged so that when the first test switch is in a conducting state the first precharge switch is in a nonconducting state. A second test switch couples between the complement bit line and a second external contact pad and the second test switch and the second precharge switch are arranged so that when the second test switch is in a conducting state the second precharge switch is in a nonconducting state.

DETAILED DESCRIPTION OF A PREFERRED EMBODIMENT

Figure 1:
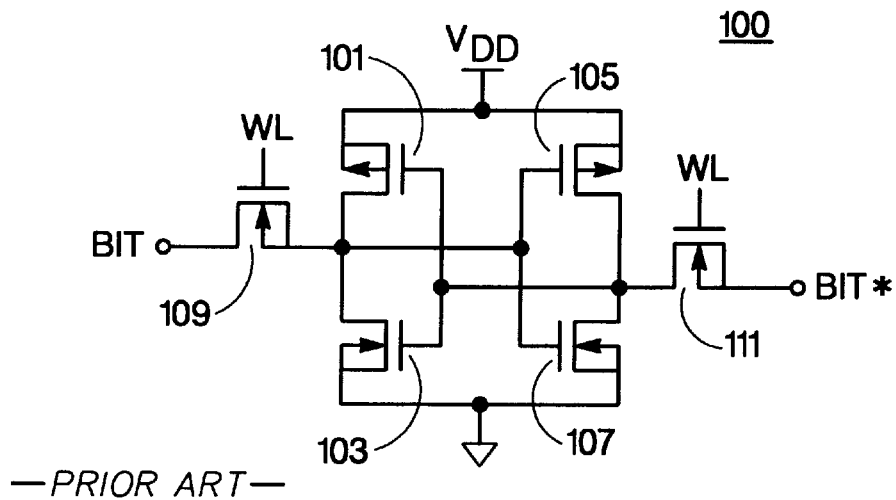
FIG. 1 is a conventional schematic diagram of a bit cell for a memory circuit.
Figure 3:
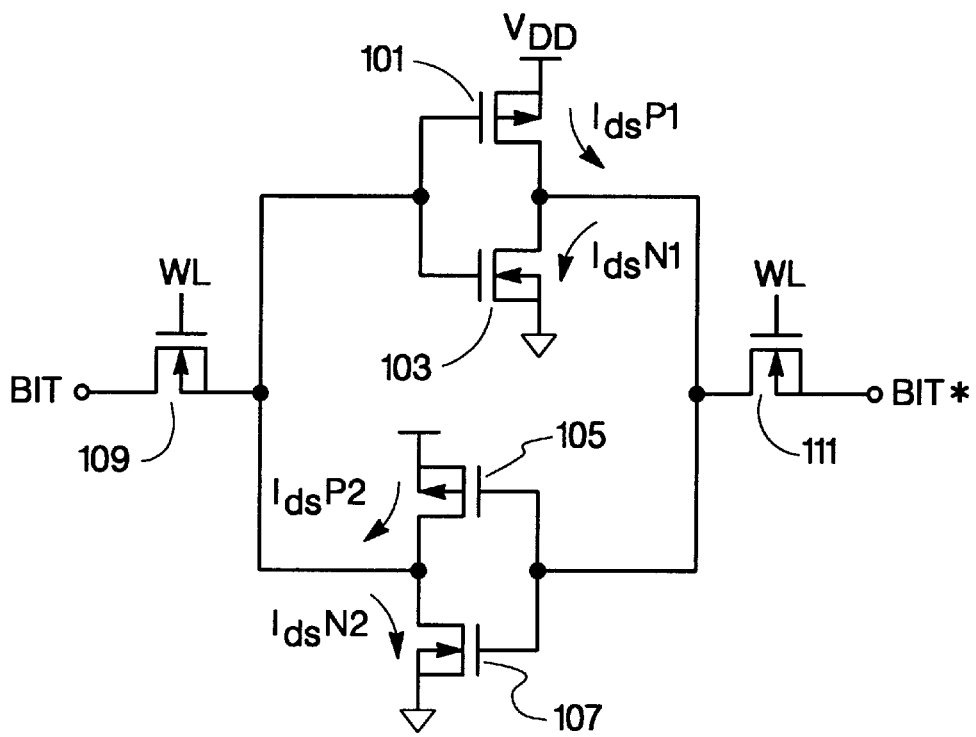
FIG. 3 is a schematic diagram of the bit cell of FIG. 1 in which the drain/source currents are indicated.
Figure 2:
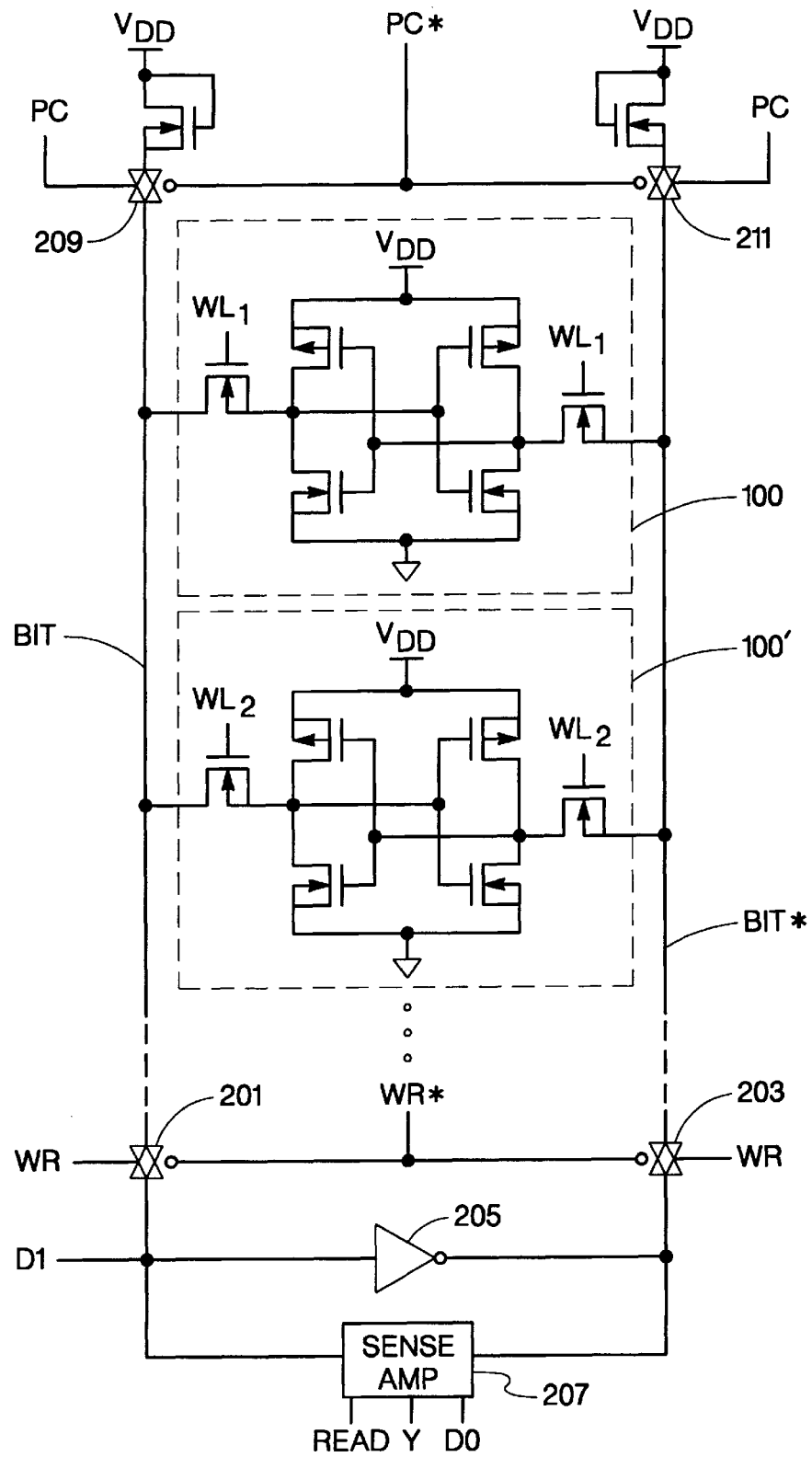
FIG. 2 is a schematic diagram of a column of bit cells including precharge and read/write circuitry.

An SRAM circuit design that enables various process defects to be analyzed without laborious microprobing and that provides flexibility in the measurement of circuit characteristics for defect analysis is encompassed in the present invention. Measurement of the DC characteristics of a portion of an IC memory device, or bit cell, allows the evaluation of individual transistors in the bit cell. The details of the measurements that can be made can best be appreciated from the circuit of FIG. 3. FIG. 3 is an expanded redrawing of the circuit of FIG. 1 in which the relationship of the individual transistors and their associated currents can be more easily depicted. The primary currents which characterize the transistors and which provide insight into some of the failure mechanisms of an SRAM are the two N-channel transistor currents $I_{off}$, $I_{DSAT}$, and the similar currents for the two P-channel transistors.

Consider the following DC parametric analysis for the four possible combinations of supply potential connection to the bit lines. If the voltage applied to bitline BIT is held at a power supply rail, for example $V_{DD}$, and the voltage applied to the other bit line BIT* is set at the opposite rail, in this example "ground", two transistor parametric current measurements can be made, one at the bit line BIT to ground and one at the bit line BIT* to $V_{DD}$. Specifically, since the N-channel transistor 107 and the P-channel transistor 101 are biased off, the current from bit line BIT to ground is the off current to $I_{off}N2$ of transistor 107 and the current on bit line BIT* is the off current $I_{off}P1$ of transistor 101. If the bit line voltages are reversed and the $V_{DD}$ rail voltage is applied to bit line BIT* and ground potential is applied to bit line BIT the off current of P-channel transistor 105 $I_{off}P2$ may be measured at the bit line BIT to ground for and the off current of N-channel transistor 103 $I_{off}N1$ may be measured at the bit line BIT* to $V_{DD}$. If supply voltage $V_{DD}$ is applied to both bit line BIT and bit line BIT*, N-channel transistor 107 is biased on and the drain to source current $I_{ds}N2$ may be measured by measuring the current from bit line BIT to ground. The N-channel transistor 103 is also biased on and the drain/source current $I_{ds}N1$ may be measured by measuring the current from bit line BIT* to ground. When both bit lines are forced to ground potential, the P-channel transistors 105 and 101 are biased on and drain to source current $I_{ds}P2$ is measured at bit line BIT to $V_{DD}$. The drain to source current for P-channel transistor 101, $I_{DSP1}$, is measured at bit line BIT* to $V_{DD}$. These forced potentials and measurable currents are summarized in table 1.

TABLE 1

| Forced BIT Potential | Forced BIT* Potential | BIT Current | BIT* Current | Failure Mode |
|---|---|---|---|---|
| $V_{DD}$ | Ground | $I_{off}N2$ | $I_{off}P1$ | transistor leakage for transistors 101 and 107 |
| ground | $V_{DD}$ | $I_{off}P2$ | $I_{off}N1$ | Transistor leakage for transistors 103 and 105 |
| $V_{DD}$ | $V_{DD}$ | $I_{ds}N2$ | $I_{ds}N1$ | saturation current for transistors 107 and 103 |
| ground | Ground | $I_{ds}P2$ | $I_{ds}P1$ | saturation current for transistors 101 and 105 |

It can be seen that the leakage currents for the latch transistors 101, 103, 105 and 107 can be determined by measurements at the bit line BIT and the bit line BIT*. ground. Furthermore, the saturation current for transistors 101, 103, 105, and 107 may also be measured at the bit lines. It should be noted that the coupling transistors 109 and 111 provide a small voltage drop source-drain and thereby prevent a true measurement of saturation current but the effect is slight and characterization of improperly operating transistors can be established in spite of the lack of full saturation.

Figure 4:
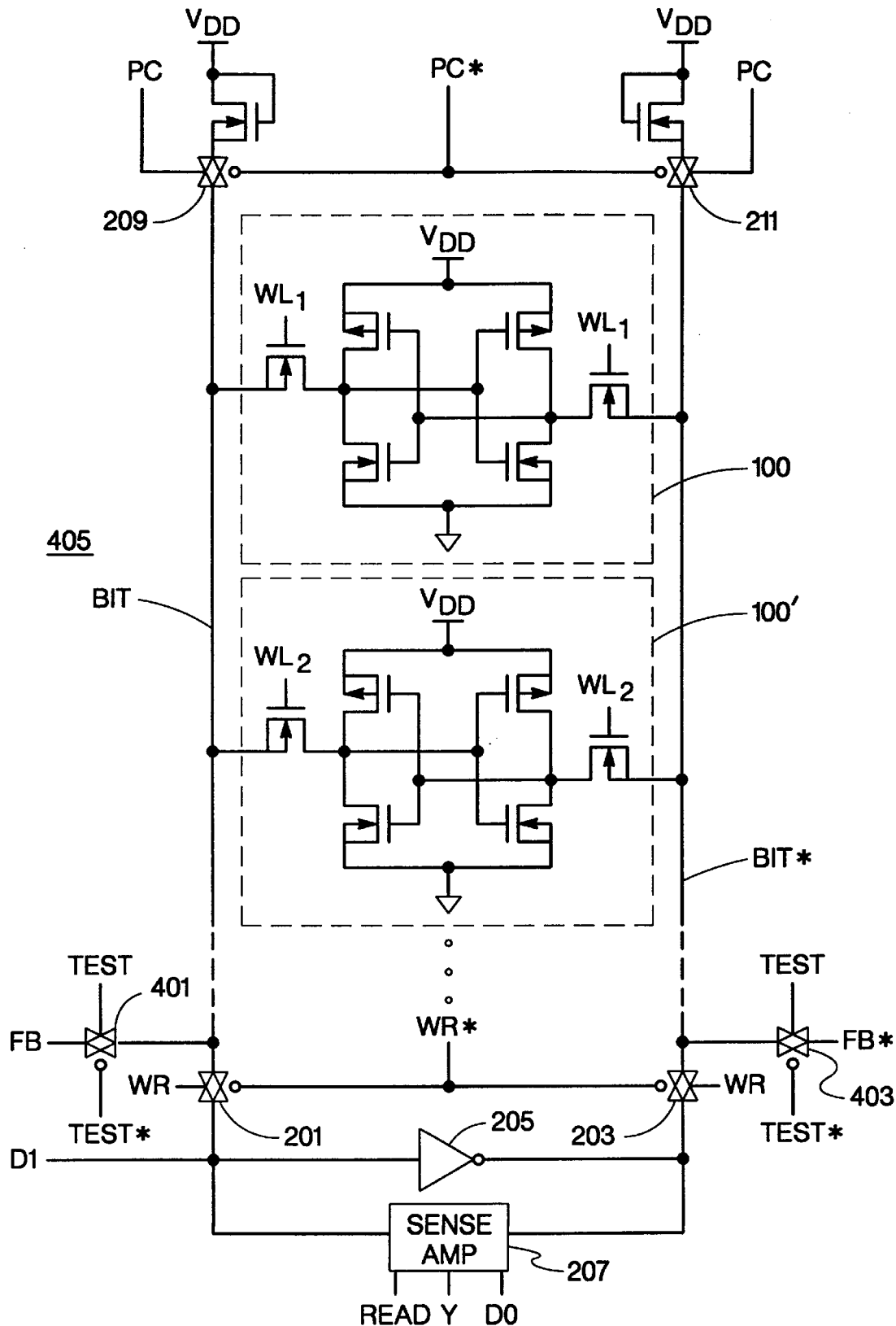
FIG. 4 is a schematic diagram of a column of bit cells with precharge, read/write, and test mode circuitry.
Figure 5:
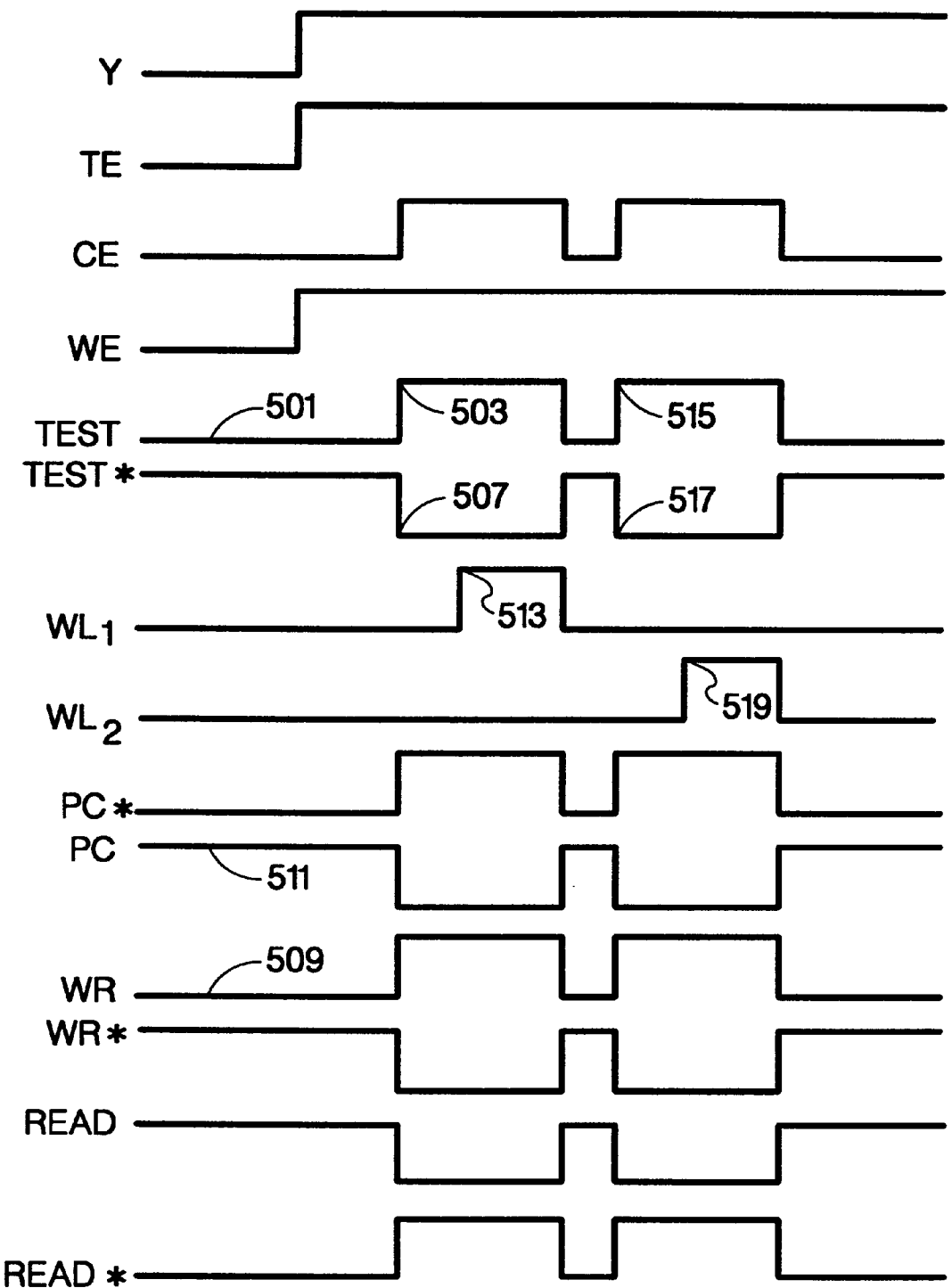
FIG. 5 is a timing diagram relating test mode and read/write select and precharge control signals.

Failure mechanisms of the particular transistors of a bit cell can be determined from deviations in the off current and the drain/source current which is measured at the bit lines. It is a feature of the present invention that evolution of bit cell transistors is made from readily available contact pads, thereby negating the need for microprobing the IC. The circuitry needed to facilitate automated measurement includes logic routing and external pads to allow external biasing of selected bit lines and their complements. This circuitry is shown in FIG. 4 in which the bit line BIT and its complement BIT* line are coupled to external connect pads disposed on the semiconductor surface of the IC. In particular, bit line BIT is coupled to a Force Bit line "FB" by way of a transmission gate 401. In similar fashion bit line BIT* is coupled to Force Bit* "FB*" line by way of transmission gate 403. Gates 401 and 403 act as test mode switches to couple the respective FB and FB*lines to the BIT and BIT* bit lines when a measurement of the transistors of a selected bit cell are to be evaluated. When the TEST line and the TEST* line are activated the transmission gates 401 and 403 forming the test switch are caused to be conducting. In this state, the transmission gates 401 and 403 conduct a signal placed on the FB or FB* to the BIT or BIT* bitlines. Alternatively, a measurement of the BIT and BIT* bit lines may be made. As shown in the timing diagram of FIG. 5, the interaction of the control signals TEST, TEST*, WR, WR*,PC and PC* is arranged in the preferred embodiment so that one or more columns of bit cells may be isolated from the standard precharge and read/write functions of a memory circuit. The sense amp 207 and the write driver 205, which are normally associated with the normal operation of the bit cells, are disconnected from the BIT lines by the select switch transmission gates 201 and 203. Further, to disconnect the bit cell column from the precharge circuit, gates 209 and 211 are caused to be in the nonconducting state. Individual bit cells of a column are selectable by activation of the word line, WL, control line. When the control signal for the TEST line 501 is energized (at 503) and when the control signal for the TEST* line 505 is complementarily energized (at 507), the select read/write WR control line 509 and the precharge PC control line 511 are maintained at a deenergized state. To select a particular bit cell for evaluation, one of the word lines is energized. As shown at 513, WL, is energized during the energization of TEST and TEST* lines (at 503 and 507) so that the latch circuit transistors of bit cell 100 are available to the FB and FB* lines. Signals placed on external contact pads for the FB and FB* lines are coupled to the transistors of bit cell 100 by way of transmission gates 401 and 403 and bit lines BIT and BIT*. Upon deactivation of the TEST and TEST* lines and word line $WL_1$, the memory circuit returns to normal operation. In a similar fashion, the transistors of bit cell 100' may be evaluated by energizing the TEST control line (at 515) and the TEST* control line (at 517) and then energizing the word line $WL_2$ (at 519).

Figure 6:
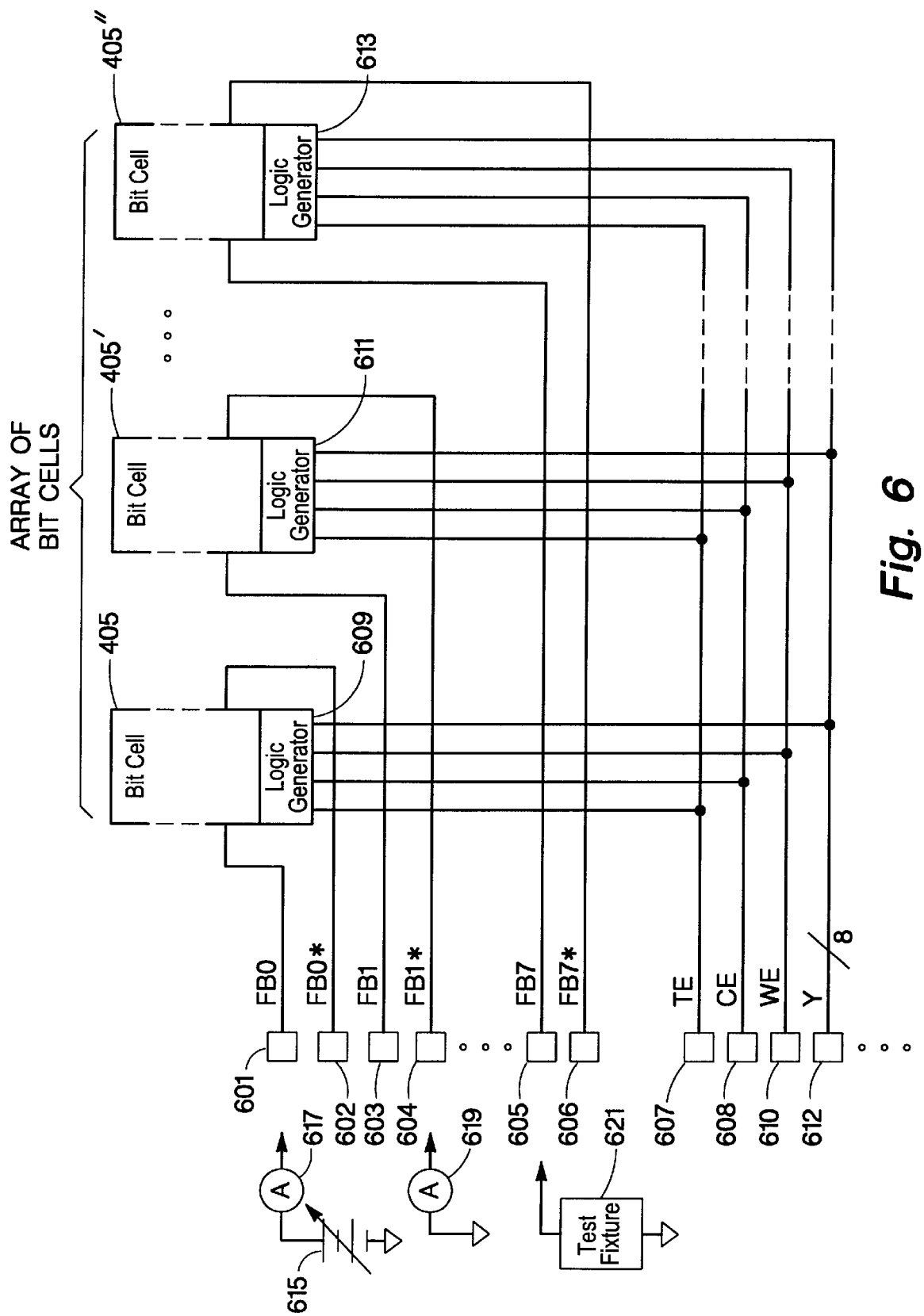
FIG. 6 is a block diagram illustrating an array of bit cells having external contact pads.

More than one bit cell column 405 may be arranged in a single bit, four bit, eight bit, sixteen bit, or similar configuration to produce a parallel memory structure. In the preferred embodiment an eight bit wide grouping is employed for an eight bit byte of memory information. This arrangement is shown in FIG. 6. A total of eight bit cell columns (405, 405', and 405") are representative members of the eight bit columns. Each bit cell column 405, 405' and 405" is coupled to respective external contact pads (601–606 in the preferred embodiment) to which the FB line and its complement FB* are made available for easy connection to off-chip components. An external contact pad for the TEST, CE, and WE signals 607, 608, and 610 respectively, are also made available for external, off-chip connection. The Y signal is generated as a result of inputs to the column decoder circuitry.

The preferred embodiment provides logic control of the bit cell control lines with circuitry placed on the IC. The complement (TEST*) line is conventionally generated from the TEST line and both the TEST signal and the complement TEST signal are coupled to each bit cell column by way of logic generators 609, 611, and 613 in the preferred embodiment. It is these logic generators that provide the WR and WR* signals and the PC and PC* signals used during the test mode operation.

Figure 7:
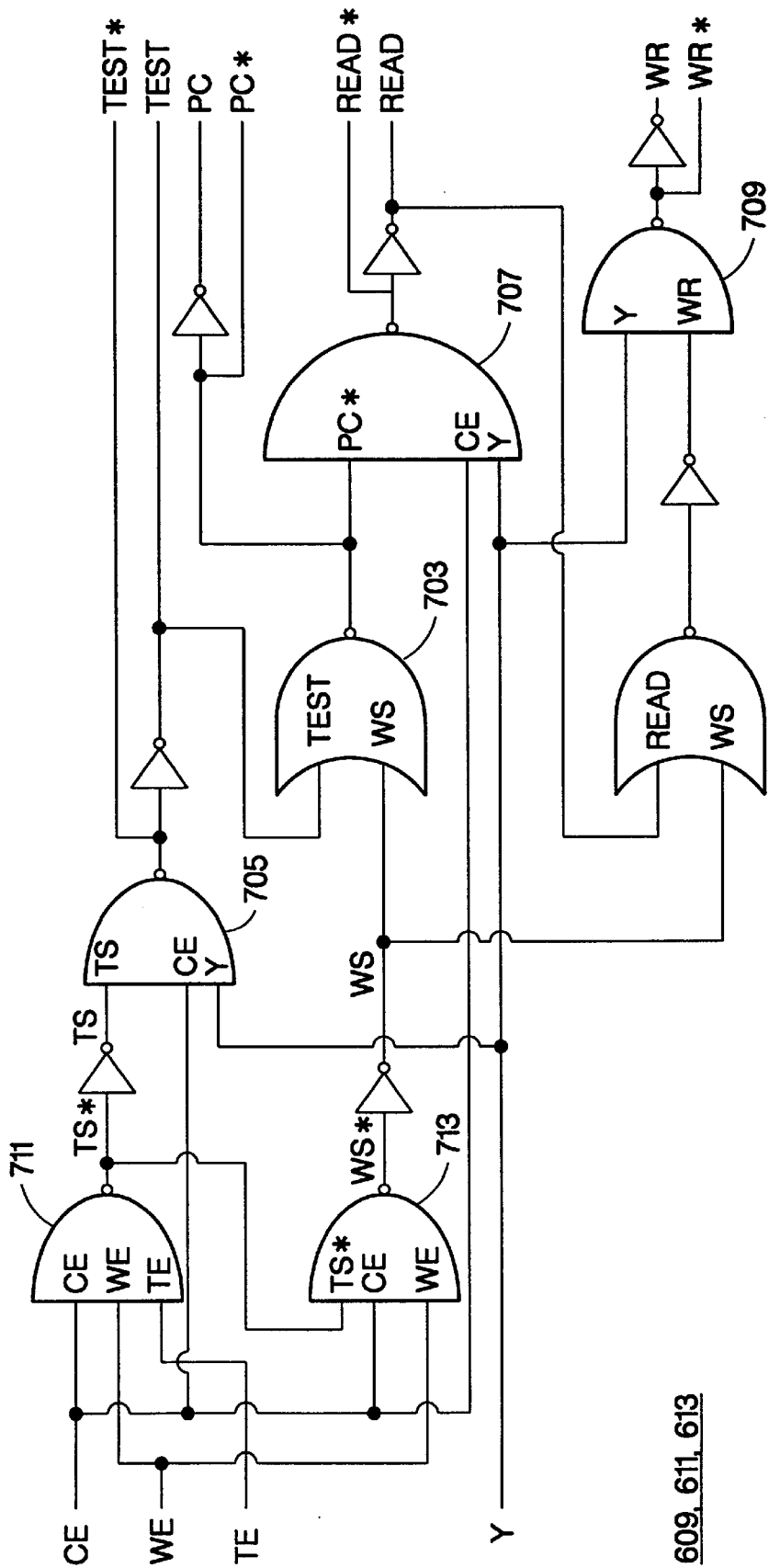
FIG. 7 is a schematic diagram of a test mode logic block.

The necessary control lines from the logic generators 609, 611 and 613 are shown in the schematic diagram of FIG. 7 in which enable inputs CE, WE, TE, and Y are logically arranged to control Test, Read, Write, and Standby modes of each selected column. It is important to note that enable line CE provides the last rising edge to the logic shown for the preferred embodiment. A valid current reading is available after the CE line rises. The resulting output from the logic generator 609, 611, or 613 is coupled to their respective bit cells 405, 405', and 405". It can be seen that precharge control PC and PC* are not enabled when either the test enable TE or the WE lines are activated as directed by OR gate 703. The column select line, Y, must be made active to obtain a TEST, Read, or WR (and respective complement) output and operates through AND gates 705,707, and 709. The chip enable line, CE, enables all or a predetermined selection of bit cells on the integrated circuit by providing an appropriate level to AND gates 705, 707, 711, and 713. Table II illustrates the applicable truth for logic generator 609,611,or 613.

TABLE II

| (Y is selected in all cases) | | | |
|---|---|---|---|
| CE | WE | TE | MODE |
| 1 | 1 | 1 | TEST |
| 1 | 1 | 0 | WRITE |
| 1 | 0 | X | READ |
| 0 | X | X | ISTBY |

Returning now to FIG. 6, it can be seen that an externally positioned voltage source 615 can be connected in series with an external microameter 617 to measure the leakage and $I_{ds}$ currents described above. Likewise an external microameter 619 may be coupled between ground and appropriate external contact pads to measure the aforementioned leakage and $I_{ds}$ currents.

Figure 8:
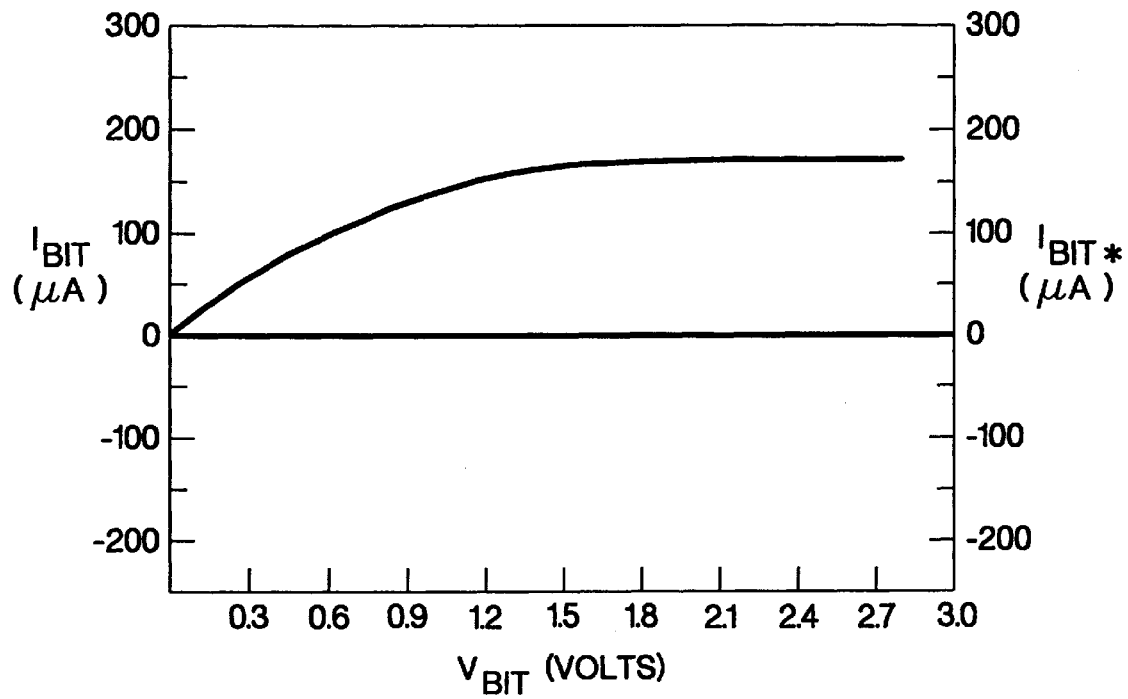
FIG. 8 is a voltage versus current graph of a bit cell latch transistor.
Figure 9:
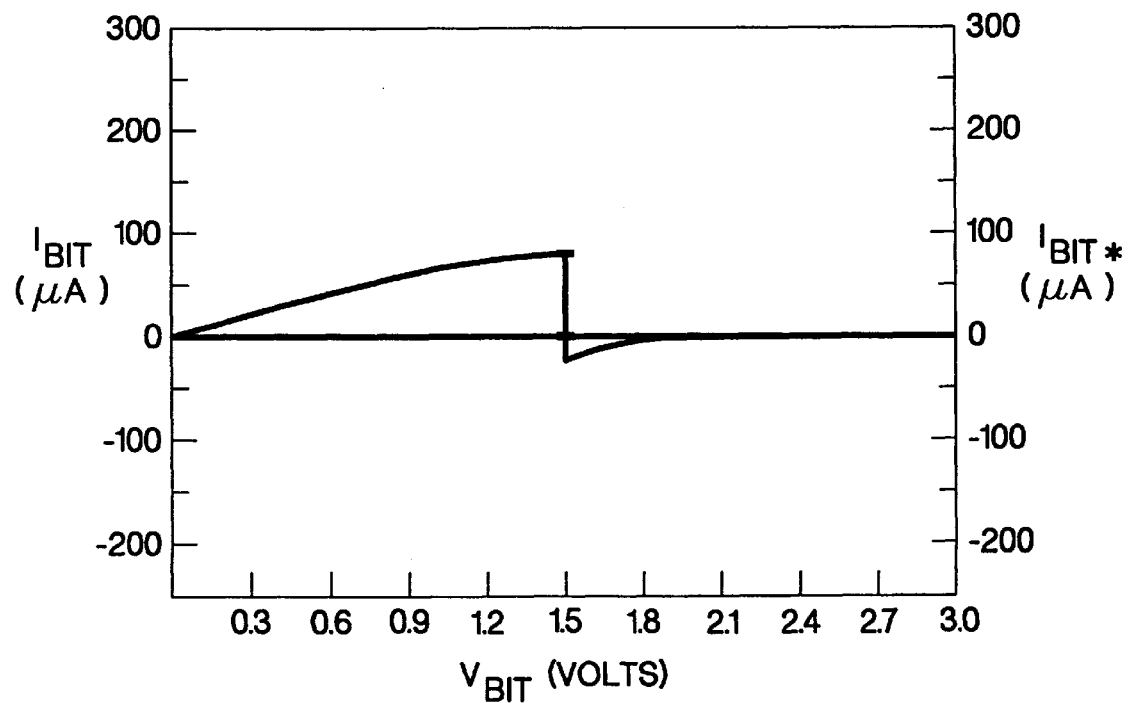
FIG. 9 is a voltage versus current graph of a defective bit cell latch transistor.
Figure 10:
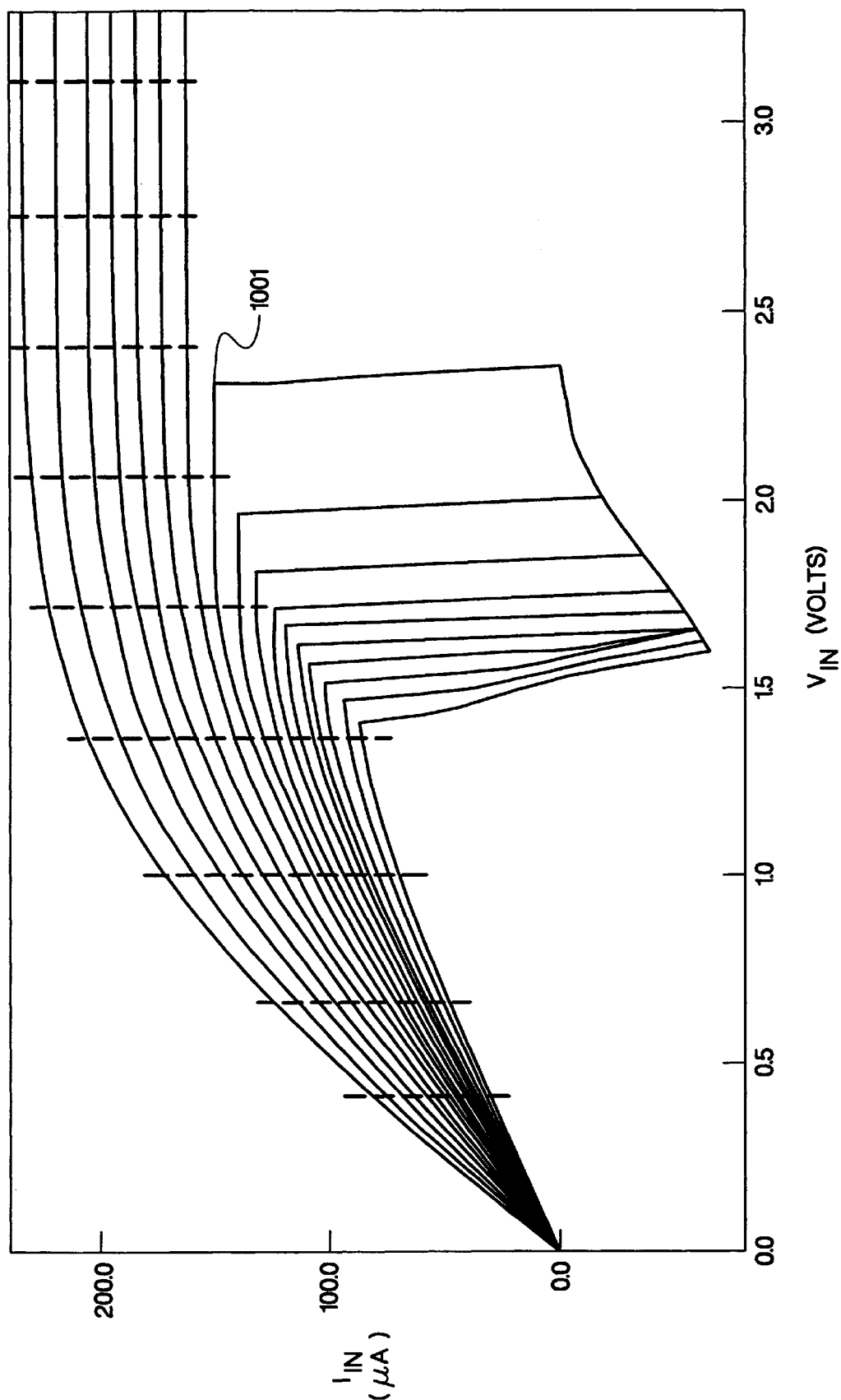
FIG. 10 is a voltage versus current simulation graph for a bit cell latch transistor having a variable amount of source resistance.

A greater range of measurements and substantially greater circuit failure analysis can be achieved if a more complicated test fixture is coupled to one or more of the external contact pads. This test fixture is diagrammatically shown as box 621. Such a test fixture, in the preferred embodiment, is a DC parametric analyzer such as an HP4156A available from Hewlett-Packard Co. or equivalent. It can be used to provide curve tracing and other variable voltage/variable current measurements. A conventional voltage versus current relationship is shown in the graph of FIG. 8. In this graph the voltage applied to bit line BIT is varied from 0 to 3.0 volts and the current on the bit line BIT is measured and displayed as trace 801. In FIG. 8 the relationship shows the distinctive characteristics of a good N-channel transistor. A similar variable voltage versus current graph is shown in FIG. 9. In the example of FIG. 9, the voltage/current characteristics of a defective N-channel transistor is shown. A failure mode is detected. The characteristics displayed in the defective current versus voltage trace indicates that the bit cell flips to an opposite state making a transition, at 903, to a negative current at the bit line BIT. Additional analysis is needed to determine a failure mechanism. Since an external connection has been made readily available with the application of the present invention, more powerful analytical tools (for example test fixture 621) can be connected to the bit lines by way of the FB and FB* lines and test mode feature.

To obtain precise identification of process defects, particularly those which are more repetitive, SPICE modeling of the defect is made. The results of the spice model for each defect is kept in a defect model library for future comparision to actual defects. Chip or wafer defects are detected by an automated test instrument, which obtains empirical data characterizing the defect. The empirical data is then compared to appropriate modeled results stored in the model library, correlation is determined, and a defect mechanism is identified. As one example of the defect identification process, one bit cell demonstrates an inappropriate latch flipping. In the model a series resistance has been inserted at the N-channel transistor 107 source, the series resistance was varied over values from 500 to 10,000 ohms, and the modeled voltage applied gate to ground was varied from 0 to 3 volts. When a series resistance greater than about 4,000 ohms was introduced into the SPICE model a significant change 1001 is observed in the V-I curves. This characteristic response is similar to that found in the empirical measurement of device performance of FIG. 9. The knowledge developed from the earlier analyses and saved in the defect library, a mechanism of failure in the processing is quickly extrapolated from the SPICE model. In the example considered here, the anomalous behavior is determined to be due to a failure mechanism in the ground contact of N-channel transistor 107. The ground contact structure of the device process can therefore be modified to eliminate the problem in future manufacture of the evaluated version of ICs.

Many of the limitations and much of the labor intensive analysis can be performed automatically by including the present invention in SRAM designs. Analysis of measured currents on the bit lines can lead to rapid detection of process related problems in the SRAM. Additionally, providing externally available contact pads with test mode capabilities dramatically reduces the amount of labor intensive and time consuming microprobe measurements required to analyze nonvisible SRAM defects.

We claim:

1. A method for testing an integrated SRAM circuit having at least on bit cell coupled to a first bit line and a complement bit line, comprising the steps of:

applying power supply voltage and return to the at least one bit cell;

enabling a first test switch coupling a first external contact pad to the first bit line and enabling a second test switch coupling a second external contact pad to the complement bit line;

coupling one of externally sourced power supply voltage and externally sourced power supply return to each of said first external contact pad and said second external contact pad; and measuring the current into said first external contact pad and into said second external contact pad whereby an anomalous current may be detected.

2. The method in accordance with the method of claim 1 in which the bit cell utilizes first and second P-channel transistors and first and second N-channel transistors in a latch configuration, said coupling step further comprising the steps of coupling externally sourced power supply voltage to said first external contact pad and coupling externally sourced power supply return to said second external contact pad, and said measuring step further comprising the steps of measuring $I_{off}$ of said second N-channel transistor into said first external contact pad and measuring $I_{off}$ of said first P-channel transistor into said second external contact pad.

3. The method in accordance with the method of claim 1 in which the bit cell utilizes first and second P-channel transistors and first and second N-channel transistors in a latch configuration, said coupling step further comprising the steps of coupling externally sourced power supply voltage to said second external contact pad and coupling externally sourced power supply return to said first external contact pad, and said measuring step further comprising the steps of measuring $I_{off}$ of said second P-channel transistor into said first external contact pad and measuring $I_{off}$ of said first N-channel transistor into said second external contact pad.

4. The method in accordance with the method of claim 1 in which the bit cell utilizes first and second P-channel transistors and first and second N-channel transistors in a latch configuration, said coupling step further comprising the steps of coupling externally sourced power supply voltage to said first and second external contact pads, and said measuring step further comprising the steps of measuring $I_{ds}$ of said second N-channel transistor into said first external contact pad and measuring $I_{ds}$ of said first N-channel transistor into said second external contact pad.

5. The method in accordance with the method of claim 1 in which the bit cell utilizes first and second P-channel transistors and first and second N-channel transistors in a latch configuration, said coupling step further comprising the steps of coupling externally sourced power supply return to said first and second external contact pads, and said measuring step further comprising the steps of measuring $I_{DS}$ of said second P-channel transistor into said first external contact pad and measuring $I_{ds}$ of said first P-channel transistor into said second external contact pad.

6. A method for testing an integrated SRAM circuit having at least on bit cell coupled to a first bit line and a complement bit line, comprising the steps of:

applying power supply voltage and return to the at least one bit cell;

enabling a first test switch coupling a first external contact pad to the first bit line and enabling a second test switch coupling a second external contact pad to the complement bit line;

coupling one of externally sourced variable voltage and externally sourced return to each of said first external contact pad and said second external contact pad;

varying the magnitude of voltage of said externally sourced variable voltage; and measuring the current into said first external contact pad as a function of said magnitude of voltage of said externally sourced variable voltage, and measuring the current into said second external contact pad as a function of said magnitude of voltage of said externally sourced variable voltage whereby a current/voltage relationship is measured for each of said first and second external contact pads.

7. The method in accordance with the method of claim 6 in which the bit cell utilizes first and second P-channel transistors and first and second N-channel transistors in a latch configuration, said coupling step further comprising the steps of coupling externally sourced variable voltage to said first external contact pad and coupling externally sourced return to said second external contact pad, and said measuring step further comprising the steps of measuring off current of said second N-channel transistor into said first external contact pad and measuring off current of said first P-channel transistor into said second external contact pad.

8. The method in accordance with the method of claim 7 further comprising the step of comparing said measured off current/voltage relationships to a plurality of predetermined current/voltage relationships corresponding to known failures, whereby a failure mechanism for the tested integrated SRAM circuit can be established.

9. The method in accordance with the method of claim 7 further comprising the step of comparing said measured off current/voltage relationships to a plurality of predetermined current/voltage relationships corresponding to known failures, whereby a failure mechanism for the tested integrated SRAM circuit can be established.

10. The method in accordance with the method of claim 6 in which the bit cell utilizes first and second P-channel transistors and first and second N-channel transistors in a latch configuration, said coupling step further comprising the steps of coupling externally sourced variable voltage to said first external contact pad and coupling externally sourced variable voltage to said second external contact pad, and said measuring step further comprising the steps of measuring drain/source current of said second N-channel transistor into said first external contact pad and measuring drain/source current of said first N-channel transistor into said second external contact pad.

11. The method in accordance with the method of claim 10 further comprising the step of comparing said measured drain/source current/voltage relationship to a plurality of predetermined current/voltage relationships corresponding to known failures, whereby a failure mechanism for the tested integrated SRAM circuit can be established.

12. The method in accordance with the method of claim 10 further comprising the step of comparing said measured drain/source current/voltage relationship to a plurality of predetermined current/voltage relationships corresponding to known failures, whereby a failure mechanism for the tested integrated SRAM circuit can be established.

13. A method of manufacturing an integrated circuit having external test access to individual bit cells, comprising the steps of:

disposing at least one bit cell in a semiconductor substrate;

coupling a first bit line and a complement bit line to said at least one bit cell;

coupling a first precharge switch to said first bit line and coupling a second precharge switch to said complement bit line; and coupling a first test switch between said first bit line and a first external contact pad and coupling a second test switch between said complement bit line and a second external contact pad;

arranging said first test switch and said first precharge switch so that when said first test switch is in a conducting state said first precharge switch is in a non-conducting state; and arranging said second test switch and said second precharge switch so that when said second test switch is in a conducting state said second precharge switch is in a non-conducting state.

14. The method in accordance with the method of claim 13 further comprising the steps of:

coupling a first select switch to said first bit line whereby a data bit of a first logic level may be presented to said first bit line and coupling a second select switch to said complement bit line whereby a data bit of a logic level that is a complement logic level to said first logic level may be presented to said complement bit line; and arranging said first select switch and said first test switch such that when said first test switch is in a conducting state said first select switch is in a non-conducting state, and arranging said second select switch and said second test switch such that when said second test switch is in a conducting state said second select switch is in a non-conducting state.

15. A method of manufacturing an integrated circuit having external test access to individual bit cells, comprising the steps of:

disposing at least one bit cell in a semiconductor substrate;

coupling a first bit line and a complement bit line to said at least one bit cell;

coupling a first select switch to said first bit line whereby a data bit of a first logic level may be presented to said first bit line and coupling a second select switch to said complement bit line whereby a data bit of a logic level that is a complement logic level to said first logic level may be presented to said complement bit line;

coupling a first test switch between said first bit line and a first external contact pad and coupling a second test switch between said complement bit line and a second external contact pad; and arranging said first test switch and said first select switch such that when said first test switch is in a conducting state said first select switch is in a non-conducting state, and arranging said second test switch and said second select switch such that when said second test switch is in a conducting state said second select switch is in a non-conducting state.

16. The method in accordance with the method of claim 15 further comprising the steps of:

coupling a first precharge switch to said first bit line and coupling a second precharge switch to said complement bit line;

arranging said first precharge switch and said first test switch such that when said first test switch is in a conducting state said first precharge switch is in a non-conducting state; and arranging said second precharge switch and said second test switch such that when said second test switch is in a conducting state said second precharge switch is in a non-conducting state.

* * * * *